US 10,914,018 B2

(12) United States Patent
Pielmeier et al.

(10) Patent No.: US 10,914,018 B2
(45) Date of Patent: Feb. 9, 2021

(54) POROUS CU ON CU SURFACE FOR SEMICONDUCTOR PACKAGES

(71) Applicant: Infineon Technologies AG, Neubiberg (DE)

(72) Inventors: Norbert Pielmeier, Regensburg (DE); Chin Yung Lai, Melaka (MY); Swee Kah Lee, Melaka (MY); Muhammad Muhammat Sanusi, Sungai Petani (MY); Evelyn Napetschnig, Diex (AT); Nurfarena Othman, Melaka (MY); Siew Ching Seah, Melaka (MY)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/351,116

(22) Filed: Mar. 12, 2019

(65) Prior Publication Data

US 2020/0291538 A1    Sep. 17, 2020

(51) Int. Cl.
*C25D 7/12* (2006.01)
*H01L 23/495* (2006.01)
(Continued)

(52) U.S. Cl.
CPC .................. *C25D 7/12* (2013.01); *C25D 3/38* (2013.01); *H01L 21/4828* (2013.01);
(Continued)

(58) Field of Classification Search
CPC .......... C25D 7/12; C25D 3/38; H01L 21/4828; H01L 23/49541; H01L 23/49582;
(Continued)

(56) References Cited

U.S. PATENT DOCUMENTS

| 5,025,114 | A | * | 6/1991 | Braden | ............... H01L 21/4825 |
| | | | | | 174/530 |
| 2007/0114676 | A1 | * | 5/2007 | Anderson | ............... H01L 24/91 |
| | | | | | 257/787 |

(Continued)

OTHER PUBLICATIONS

Cherevko, Serhiy, et al., "The porous CuO electrode fabricated by hydrogen bubble evolution and its application to highly sensitive non-enzymatic glucose detection", Talanta 80, 2010, pp. 1371-1377.

(Continued)

*Primary Examiner* — Andy Huynh
(74) *Attorney, Agent, or Firm* — Murphy, Bilak & Homiller, PLLC (57) ABSTRACT

A semiconductor package includes a plurality of metal leads and a semiconductor die attached to the plurality of metal leads by an interconnect. A surface of the plurality of metal leads, a metallized surface of the semiconductor die, and/or a surface of the interconnect comprises Cu and has a thermal conductivity in a range of 340 to 400 W/mK and an electrical conductivity in a range of 80 to 110% IACS. One or more of the surfaces which comprise Cu and have a thermal conductivity in the range of 340 to 400 W/mK and an electrical conductivity in the range of 80 to 110% IACS also includes micropores having a diameter in a range of 1 μm to 10 μm. A method of manufacturing a metal surface with such micropores also is described.

28 Claims, 8 Drawing Sheets

(51) Int. Cl.
H01L 23/00 (2006.01)
H01L 23/498 (2006.01)
H01L 21/48 (2006.01)
C25D 3/38 (2006.01)

(52) U.S. Cl.
CPC .. H01L 23/49541 (2013.01); H01L 23/49582 (2013.01); H01L 23/49838 (2013.01); H01L 24/11 (2013.01); H01L 24/13 (2013.01); H01L 24/16 (2013.01); H01L 24/27 (2013.01); H01L 24/29 (2013.01); H01L 24/35 (2013.01); H01L 24/37 (2013.01); H01L 2224/11825 (2013.01); H01L 2224/11831 (2013.01); H01L 2224/13011 (2013.01); H01L 2224/13019 (2013.01); H01L 2224/13147 (2013.01); H01L 2224/16225 (2013.01); H01L 2224/16245 (2013.01); H01L 2224/27825 (2013.01); H01L 2224/27831 (2013.01); H01L 2224/29011 (2013.01); H01L 2224/29019 (2013.01); H01L 2224/29147 (2013.01); H01L 2224/32245 (2013.01); H01L 2224/35125 (2013.01); H01L 2224/37011 (2013.01)

(58) Field of Classification Search
CPC ... H01L 23/49838; H01L 24/11; H01L 24/13; H01L 24/16; H01L 24/27; H01L 24/29; H01L 24/35; H01L 24/37
USPC ........................................................ 257/676
See application file for complete search history.

(56) References Cited

U.S. PATENT DOCUMENTS

2007/0278632 A1* 12/2007 Zhao ...................... H01L 24/97
  257/676
2010/0155260 A1 6/2010 Kwan et al.
2013/0292812 A1* 11/2013 Seo ........................ H01L 33/486
  257/676

OTHER PUBLICATIONS

Dong, Changsheng, et al., "Fabrication of superhydrophobic Cu surfaces with tunable regular micro and random nano-scale structures by hybrid laser texture and chemical etching", Journal of Materials Process Technology; vol. 211, Issue 7, Jul. 2011, pp. 1234-1240.
Herraiz-Cardona, I., et al., "Double-template fabrication of three-dimensional porous nickel electrodes for hydrogen evolution reaction", International Journal of Hydrogen Energy 37, 2012, pp. 2147-2156.
Kawanaka, Takuma, et al., "Selective Surface Texturing Using Electrolyte Jet Machining", Procedia CIRP 13; 2nd CIRP Conference on Surface Integrity (CSI), 2014, pp. 345-349.
Kietzig, Anne-Marie, et al., "Laser-Patterned Super-Hydrophobic Pure Metallic Substrates: Cassie to Wenzel Wetting Transitions", Journal of Adhesion Science and Technology 25, 2011, pp. 2789-2809.
Ta, Van Duong, et al., "Laser textured superhydrophobic surfaces and their applications for homogeneious spot deposition", Applied Surface Science 365, 2016, pp. 153-159.
Guo, Xiagang, et al., "Effects of Surfactants on High Regularity of 3D Porous Nickel for Zn2+ Adsorption Application", Hindawi Publishing Corporation, Journal of Nanomaterials, vol. 2014, pp. 1-9.
Nam, Dohwan, et al., "Effects of (NH4)2SO4 and BTA on the nanostructure of copper foam prepared by electrodeposition", Electrochimica Acta 56, Oct. 2011, pp. 9397-9405.
Nikolic, Nebojsa D., et al., "Determination of Critical Conditions for the Formation of Electrodeposited Copper Structures Suitable for Electrodes in Electrochemical Devices", Sensors 2007, 7, pp. 1-15.
Niu, Junchao, et al., "Effect of Electrodeposition Parameters on the Morphology of Three-Dimensional Porous Copper Foams", International Journal of Electrochemical Science, 10, 2015, pp. 7331-7340.
Wang, Hongbin, et al., "Morphologies and wetting properties of copper film with 3D porous micro-nano hierarchical structure prepared by electrochemical deposition", Applied Surface Science, 372, 2016, pp. 7-12.

* cited by examiner

POROUS CU ON CU SURFACE FOR SEMICONDUCTOR PACKAGES

BACKGROUND

Solder over spreading/overflow is a common problem for flip-chip semiconductor packages. Solder over spreading/overflow is caused by smooth leadframe surfaces and leads, and results in electrical shorts, mechanical instability, tilted chips and reliability failures. A groove may be stamped into the leadframe surface or the leadframe surface may be roughened by etching in an attempt to limit solder over spreading/overflow.

In the case of leadframe stamping, the resulting groove is limited by chip size and die placement tolerance. Also, the groove is a single reservoir which can easily be flooded and overflooded by solder. Stamping limitations yield a groove that is relatively wide (e.g. in the µm range) which is too large to efficiently inhibit solder overflow. The positioning of the groove is also prone to deviation as stamping or etching have a typical tolerance of +/−25 um to +/−50 um. Moreover, stamping a groove into a leadframe increases the complexity of the leadframe design as usage becomes limited to a specific chip symmetry (length and width). Therefore, the usage of one leadframe design for a variety of chip symmetries is not possible.

In the case of leadframe surface roughening by etching, the etching process is compatible only with low-cost leadframes which have a high content of materials like Zn, Sn and Cr. If such materials are missing and pure Cu is etched, the resulting roughness is in the low micrometer or even nanometer range which is too low to enable good wettability. Hence, the etching option is limited to leadframe materials with intrinsic contamination and further to possible quality issues for die attach and wire bond connections. The etching option also yields variable surface topographies and thereby to variable quality.

Thus, there is a need for an improved technique for limiting solder over spreading/overflow for flip-chip semiconductor packages.

SUMMARY

According to an embodiment of a semiconductor package, the semiconductor package comprises a plurality of metal leads and a semiconductor die attached to the plurality of metal leads by an interconnect. A surface of the plurality of metal leads, a metallized surface of the semiconductor die, and/or a surface of the interconnect comprises Cu and has a thermal conductivity in a range of 340 to 400 W/mK and an electrical conductivity in a range of 80 to 110% IACS (International Annealed Copper Standard). One or more of the surfaces which comprises Cu and has a thermal conductivity in the range of 340 to 400 W/mK and an electrical conductivity in the range of 80 to 110% IACS also comprises micropores having a diameter in a range of 1 µm to 10 µm.

The plurality of metal leads may be part of a leadframe, the interconnect may comprise a plurality of Cu pillars soldered to the plurality of leads, and the surface of the plurality of metal leads may comprise Cu, have a thermal conductivity in the range of 340 to 400 W/mK and an electrical conductivity in the range of 80 to 110% IACS, and comprise micropores having a diameter in a range of 1 µm to 10 µm.

Separately or in combination, the surface of the plurality of Cu pillars may have a thermal conductivity in the range of 340 to 400 W/mK and an electrical conductivity in the range of 80 to 110% IACS and may comprise micropores having a diameter in a range of 1 µm to 10 µm.

Separately or in combination, the interconnect may comprise a plurality of Cu pillars soldered to the plurality of leads and the surface of the plurality of Cu pillars may have a thermal conductivity in the range of 340 to 400 W/mK and an electrical conductivity in the range of 80 to 110% IACS and may comprise micropores having a diameter in a range of 1 µm to 10 µm.

Separately or in combination, the surface of the plurality of Cu pillars which has a thermal conductivity in the range of 340 to 400 W/mK and an electrical conductivity in the range of 80 to 110% IACS and comprises micropores may be a plated surface and the Cu pillars may comprise a nickel layer on which the plated surface is formed.

Separately or in combination, the semiconductor package may further comprise a metal clip attached to a terminal of the semiconductor die at a side of the semiconductor die facing away from the plurality of leads, and a surface of the metal clip may comprise Cu, have a thermal conductivity in the range of 340 to 400 W/mK and an electrical conductivity in the range of 80 to 110% IACS, and may comprise micropores having a diameter in a range of 1 µm to 10 µm.

Separately or in combination, the metallized surface of the semiconductor die may be attached to a metal die paddle and the metallized surface of the semiconductor die may comprise Cu, have a thermal conductivity in the range of 340 to 400 W/mK and an electrical conductivity in the range of 80 to 110% IACS, and may comprise micropores having a diameter in a range of 1 µm to 10 µm.

Separately or in combination, each surface which comprises Cu, has a thermal conductivity in the range of 340 to 400 W/mK and an electrical conductivity in the range of 80 to 110% IACS, and comprises micropores may be a plated surface on a Cu alloy.

Separately or in combination, each surface which comprises Cu, has a thermal conductivity in the range of 340 to 400 W/mK and an electrical conductivity in the range of 80 to 110% IACS, and comprises micropores may be a surface that comprises plasma-deposited Cu dust on a Cu alloy.

Separately or in combination, each surface which comprises Cu, has a thermal conductivity in the range of 340 to 400 W/mK and an electrical conductivity in the range of 80 to 110% IACS, and comprises micropores may have a surface roughness in a range of 1.5 µm and 20 µm.

Separately or in combination, the semiconductor package may further comprise a mold compound encapsulating the semiconductor die and the mold compound may be in contact with some of the micropores.

According to an embodiment of a method of manufacturing a semiconductor package, the method comprises: forming a surface on a plurality of metal leads and which comprises Cu and has a thermal conductivity in a range of 340 to 400 W/mK and an electrical conductivity in a range of 80 to 110% IACS, a metallized surface on a semiconductor die and which comprises Cu and has a thermal conductivity in the range of 340 to 400 W/mK and an electrical conductivity in the range of 80 to 110% IACS, and/or a surface on an interconnect and which comprises Cu and has a thermal conductivity in the range of 340 to 400 W/mK and an electrical conductivity in the range of 80 to 110% IACS; forming micropores in one or more of the surfaces which comprises Cu and has a thermal conductivity in the range of 340 to 400 W/mK and an electrical conductivity in the range of 80 to 110% IACS, the micropores having a diameter in a range of 1 µm to 10 µm; and attaching the semiconductor die to the plurality of metal leads by the interconnect.

The plurality of metal leads may be part of a leadframe, the interconnect may comprise a plurality of Cu pillars, and the surface of the plurality of metal leads may comprise Cu, have a thermal conductivity in the range of 340 to 400 W/mK and an electrical conductivity in the range of 80 to 110% IACS, and may comprise micropores having a diameter in a range of 1 µm to 10 µm.

Separately or in combination, the surface of the plurality of Cu pillars may have a thermal conductivity in the range of 340 to 400 W/mK and an electrical conductivity in the range of 80 to 110% IACS and may comprise micropores having a diameter in a range of 1 µm to 10 µm.

Separately or in combination, the interconnect may comprise a plurality of Cu pillars soldered to the plurality of leads and the surface of the plurality of Cu pillars may have a thermal conductivity in the range of 340 to 400 W/mK and an electrical conductivity in the range of 80 to 110% IACS and may comprise micropores having a diameter in a range of 1 µm to 10 µm.

Separately or in combination, the method may further comprise: forming a surface on a metal clip and which comprises Cu and has a thermal conductivity in the range of 340 to 400 W/mK and an electrical conductivity in the range of 80 to 110% IACS; forming micropores in the surface of the metal clip, the micropores having a diameter in a range of 1 µm to 10 µm; and attaching the metal clip to a terminal of the semiconductor die at a side of the semiconductor die facing away from the plurality of leads.

Separately or in combination, the method may further comprise attaching the metallized surface of the semiconductor die to a metal die paddle, wherein the metallized surface of the semiconductor die may comprise Cu, has a thermal conductivity in the range of 340 to 400 W/mK and an electrical conductivity in the range of 80 to 110% IACS, and may and comprise micropores having a diameter in a range of 1 µm to 10 µm.

Separately or in combination, each surface which comprises Cu and has a thermal conductivity in the range of 340 to 400 W/mK and an electrical conductivity in the range of 80 to 110% IACS may be formed by an electrodeposition process and the micropores may be formed by introducing hydrogen bubbles as part of the electrodeposition process.

Separately or in combination, each surface which comprises Cu, has a thermal conductivity in the range of 340 to 400 W/mK and an electrical conductivity in the range of 80 to 110% IACS and comprises micropores may be formed by a Cu powder deposition.

Separately or in combination, the method may further comprise encapsulating the semiconductor die in a mold compound which is in contact some of the micropores.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

The embodiments described herein provide a porous surface structure which limits solder over spreading/overflow in semiconductor packages. The porous surface structure may be provided on the metal leads of the package, on a metallized surface of a semiconductor die included in the package, and/or on a surface of an interconnect which attaches the semiconductor die to the metal leads or other type of substrate. The leads may be part of a leadframe, metal traces of a printed circuit board (PCB), a patterned metallized surface of an insulative substrate such as a ceramic substrate, etc. Any type of semiconductor die or dies may be included in the package, such as one or more power transistor dies, logic die(s) such as a controller and/or driver die, passive die(s), etc. The interconnect which attaches the semiconductor die to the leads may include Cu pillars or similar structures which connect pads of the die to the package leads. Each porous surface structure comprises Cu, has a thermal conductivity in a range of 340 to 400 W/mK, e.g. 350 to 390 W/mK, and an electrical conductivity in a range of 80 to 110% IACS (International Annealed Copper Standard), e.g., 90 to 105% IACS, and includes micropores having a diameter in a range of 1 µm to 10 µm. Micropores in the range of 1 µm to 10 µm are large enough to ensure good wettability with solder, but small enough to limit solder over spreading/overflow. The micropores may be formed by an electrodeposition process during which the micropores are formed by introducing hydrogen bubbles. In another embodiment, the micropores are formed by a Cu powder deposition process. Semiconductor package embodiments which include the porous surface structure and related methods of manufacture are described next in more detail.

Figure 1:
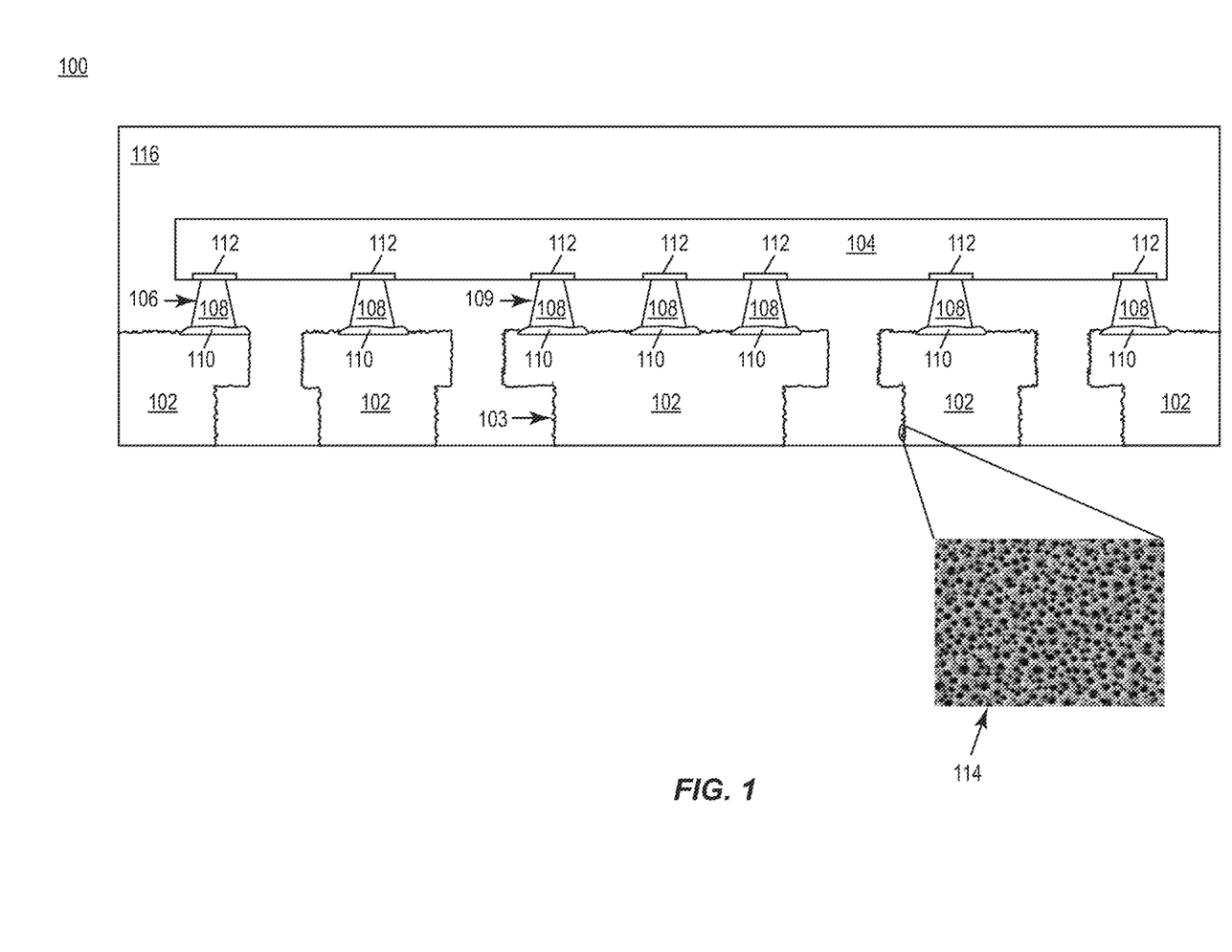
FIG. 1 illustrates a cross-sectional view of an embodiment of a semiconductor package having a porous surface structure for limiting solder over spreading/overflow.

FIG. 1 illustrates a cross-sectional view of an embodiment of a semiconductor package 100 having a porous surface structure for limiting solder over spreading/overflow. The semiconductor package 100 includes metal leads 102 and a semiconductor die 104 attached to the metal leads 102 by an interconnect 106. According to the embodiment illustrated in FIG. 1, the metal leads 102 are part of a leadframe and the interconnect 106 includes Cu pillars 108 soldered to the leads 102 at one end by solder 110 and attached to pads 112 of the semiconductor die 104 at the opposite end of the interconnect 106. The semiconductor die 104 may be a power transistor die, logic die, passive die, etc. The package 100 may include a single semiconductor die 104 or more than one die 104.

A surface 103 of the metal leads 102 and/or a surface 109 of the Cu pillars 108 comprises Cu and has a thermal conductivity in the range of 340 to 400 W/mK and an electrical conductivity in the range of 80 to 110% IACS, according to the embodiment shown in FIG. 1. One or more of the surfaces 103, 109 which comprise Cu and have a thermal conductivity in the range of 340 to 400 W/mK and an electrical conductivity in the range of 80 to 110% IACS also includes micropores 114 having a diameter in a range of 1 μm to 10 μm. That is, the surface 103 of the metal leads 102 may comprise Cu, has a thermal conductivity in the range of 340 to 400 W/mK and an electrical conductivity in the range of 80 to 110% IACS, and may also include micropores 114 having a diameter in a range of 1 μm to 10 μm, the surface 109 of the Cu pillars 108 which form the interconnect may have a thermal conductivity in the range of 340 to 400 W/mK and an electrical conductivity in the range of 80 to 110% IACS and include micropores 114 having a diameter in a range of 1 μm to 10 μm, or both surfaces 103, 109 may comprise Cu, have a thermal conductivity in the range of 340 to 400 W/mK and an electrical conductivity in the range of 80 to 110% IACS and include micropores 114 having a diameter in a range of 1 μm to 10 μm. Separately or in combination, the side of the semiconductor die 104 opposite the interconnect 106 may have a metallized surface which may comprise Cu, have a thermal conductivity in the range of 340 to 400 W/mK and an electrical conductivity in the range of 80 to 110% IACS, and include micropores 114 having a diameter in a range of 1 μm to 10 μm. Such a metallized die surface is not shown in FIG. 1 for ease of illustration, but is illustrated in another Figure and described in more detail later herein.

FIG. 1 includes an exploded view of part of the surface 103 of one lead 102 of the package, to show the micropores 114 in greater detail. Micropores 114 in the range of 1 μm to 10 μm are large enough to ensure good wettability between the solder 110 and the metal leads 102 but small enough to limit solder over spreading/overflow, as described previously herein. This way, solder over spreading/overflow is limited or even prevented altogether, allowing for precise control of the bond line thickness. The bond line thickness is the thickness of the joint between the semiconductor die 104 and a substrate or structure to which the die 104 is attached; in this case a leadframe. An uneven bond line thickness between the bottom side of the semiconductor die 104 and the leadframe leads 102 may result in die tilting. The micropores 114 formed in the surface 103 of the metal leads 102 and/or the surface 109 of the Cu pillars 108 limit the amount of solder over spreading/overflow, ensuring a relatively uniform bond line thickness and thus preventing die tilting. In the case of high density Cu pillars 108, micropores 114 formed in the surface 109 of the Cu pillars 108 also prevent solder bridging (shorting) between adjacent Cu pillars 108 by limiting the amount of solder over spreading/overflow onto the sidewalls of the Cu pillars 108.

The semiconductor package 100 may further include a mold compound 116 for encapsulating the semiconductor die 104. The mold compound 116 may be in contact with some of the micropores 114. The micropores 114 promote adhesion with the mold compound 116, and a separate adhesion promoter may be omitted from the mold compound 116 to reduce cost.

Figure 2:
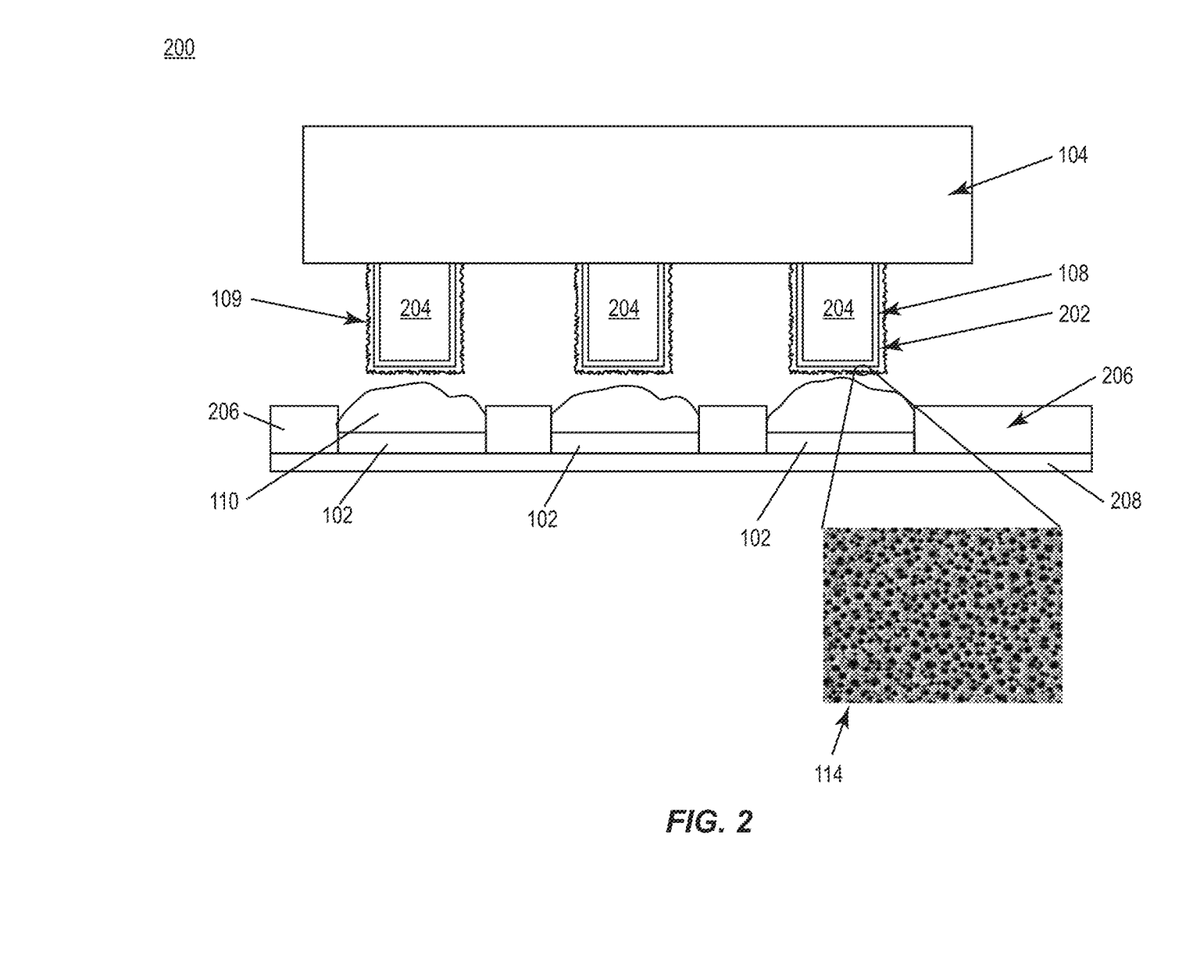
FIG. 2 illustrates a cross-sectional view of another embodiment of a semiconductor package having a porous surface structure for limiting solder over spreading/overflow.

FIG. 2 illustrates a cross-sectional view of another embodiment of a semiconductor package 200 having a porous surface structure for limiting solder over spreading/overflow. According to this embodiment, at least the interconnect 106 for attaching the semiconductor die 104 to the metal leads 102 includes Cu pillars 106 and at least the surface 109 of the Cu pillars 108 has a thermal conductivity in the range of 340 to 400 W/mK and an electrical conductivity in the range of 80 to 110% IACS and includes micropores 114 having a diameter in a range of 1 μm to 10 μm. In one embodiment, the surface 109 of the Cu pillars 108 with the micropores 114 is a plated surface formed on a nickel layer 202 and the nickel layer 202 covers a Cu base 204 of the pillars 108. Like the previous embodiment, the semiconductor die 104 may be a power transistor die, logic die, passive die, etc. and the package 200 may include a single semiconductor die 104 or more than one die 104. The package 200 may or may not include a mold compound for encapsulating the semiconductor die 104.

FIG. 2 shows the semiconductor package 200 during the manufacturing process, and provides an exploded view of part of the surface 109 of one Cu pillar 108 to show the micropores 114 in greater detail. Solder 110 is applied to the metal leads 102 using a solder mask 206. The surface of the metal leads 102 may or may not comprise Cu and have a thermal conductivity in the range of 340 to 400 W/mK and an electrical conductivity in the range of 80 to 110% IACS and may or may not include micropores 114 having a diameter in a range of 1 μm to 10 μm. The metal leads 102 may be part of a leadframe as described above in connection with FIG. 1, or instead may be metal traces of a PCB 208, a patterned metallized surface of an insulative substrate 208 such as a ceramic substrate, etc. In each case, the micropores 114 formed in the surface 109 of the Cu pillars 108 of the interconnect 106 are large enough to ensure good wettability between the solder 110 and the interconnect 106 but small enough to limit solder over spreading/overflow. This way, over spreading/overflow of the solder 110 onto the sidewalls 210 of the Cu pillars 108 is limited or prevented altogether.

Figure 3:
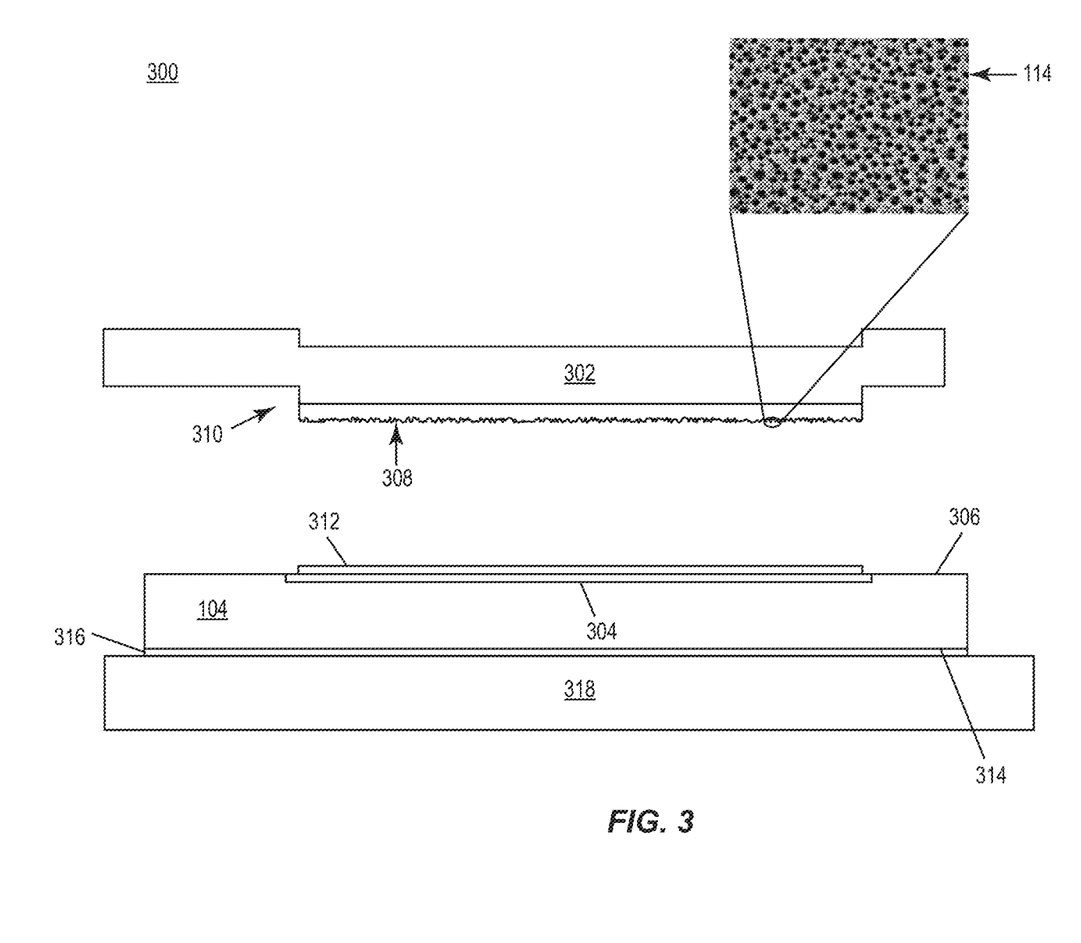
FIG. 3 illustrates a cross-sectional view of another embodiment of a semiconductor package having a porous surface structure for limiting solder over spreading/overflow.

FIG. 3 illustrates a cross-sectional view of another embodiment of a semiconductor package 300 having a porous surface structure for limiting solder over spreading/overflow. According to this embodiment, a metal clip 302 is attached to a terminal 304 of the semiconductor die 104 at a top side 306 of the die 104. The metal clip 302 may form a lead of the package 300, or may be connected to a lead of the package 300. A separate package lead is not shown in FIG. 3 for ease of illustration. A surface 308 of the metal clip 302 comprises Cu, has a thermal conductivity in the range of 340 to 400 W/mK and an electrical conductivity in the range of 80 to 110% IACS, and includes micropores 114 having a diameter in a range of 1 μm to 10 μm. The metal clip 302 may have a standoff 310 for attaching to the terminal 304 at the top side 306 of the semiconductor die 104. Like the previous embodiments, the semiconductor die 104 may be a power transistor die, logic die, passive die, etc. and the package 300 may include a single semiconductor die 104 or more than one die 104. The package 300 may or may not include a mold compound for encapsulating the semiconductor die 104.

FIG. 3 shows the semiconductor package 300 during the manufacturing process, and provides an exploded view of part of the surface 308 of the metal clip 302 to show the micropores 114 in greater detail. Solder 312 is applied to terminal at the top side 306 of the semiconductor die 104 e.g. using a screen printing process. The metal clip 302 with the porous Cu surface 308 with micropores 114 is attached to the die terminal 304 by the solder 312. The bottom side 314 of the semiconductor die 104 is attached by a die attach material 316 such as solder or an electrically conductive adhesive to a metal die paddle 318 of a leadframe or other type of substrate. The bottom side 314 of the semiconductor die 104 may or may not have a metallized surface that comprises Cu, has a thermal conductivity in the range of 340 to 400 W/mK and an electrical conductivity in the range of 80 to 110% IACS, and includes micropores 114 having a diameter in a range of 1 μm to 10 μm. In each case, the micropores 114 formed in the surface 308 of the metal clip 302 are large enough to ensure good wettability between the solder 312 applied to the top side 306 of the semiconductor die 104 and the metal clip 302. The micropores 114 are small enough to limit solder over spreading/overflow, ensuring a relatively uniform bond line thickness between the metal clip 302 and the top side 306 of the semiconductor die 104 and thus preventing die tilting.

Figure 4:
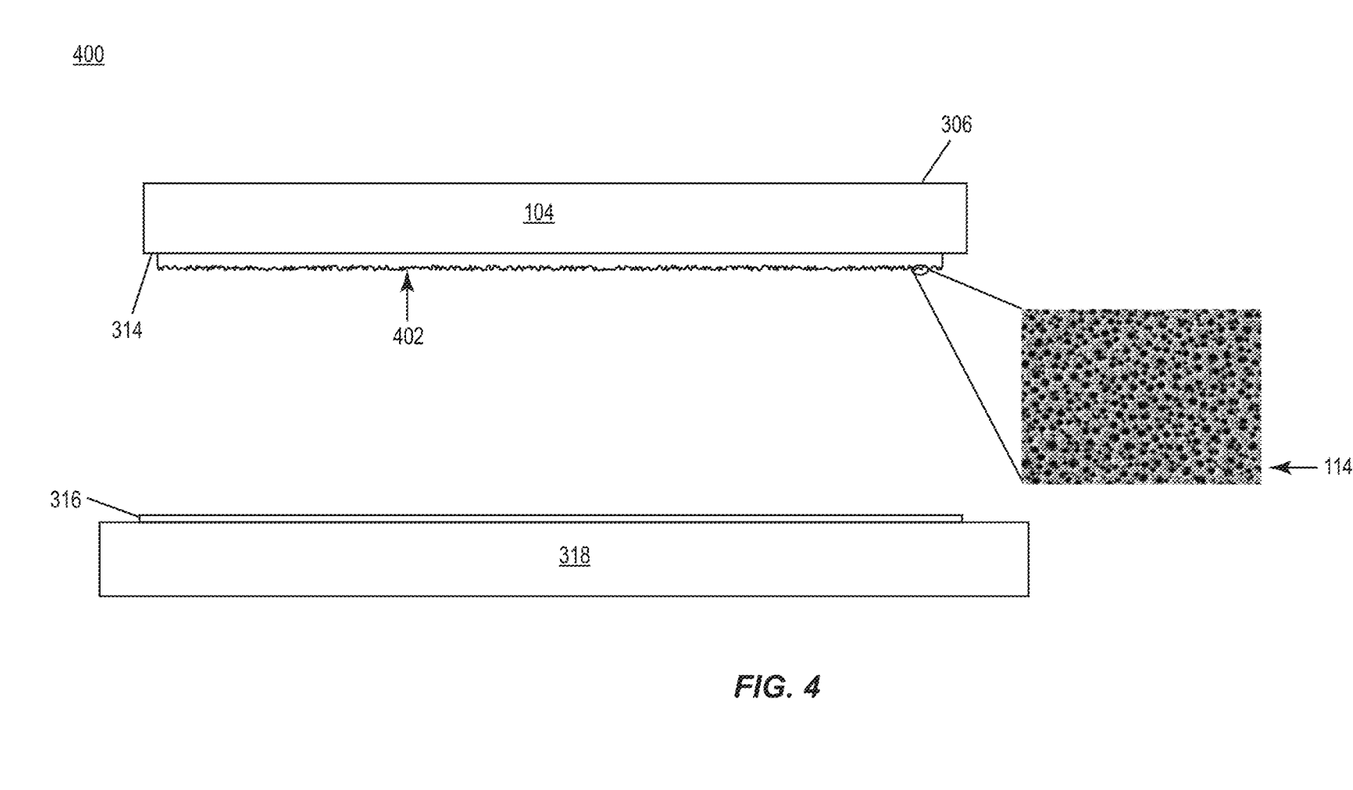
FIG. 4 illustrates a cross-sectional view of another embodiment of a semiconductor package having a porous surface structure for limiting solder over spreading/overflow.

FIG. 4 illustrates a cross-sectional view of another embodiment of a semiconductor package 400 having a porous surface structure for limiting solder over spreading/overflow. According to this embodiment, the bottom side 314 of the semiconductor die 104 has a metallized surface 402 attached to a metal die paddle 318 of a leadframe or other type of substrate. The metallized surface 402 of the semiconductor die 104 comprises Cu, has a thermal conductivity in the range of 340 to 400 W/mK and an electrical conductivity in the range of 80 to 110% IACS, and includes micropores 114 having a diameter in a range of 1 μm to 10 μm. Like the previous embodiments, the semiconductor die 104 may be a power transistor die, logic die, passive die, etc. and the package 400 may include a single semiconductor die 104 or more than one die 104. The package 400 may or may not include a mold compound for encapsulating the semiconductor die 104.

FIG. 4 shows the semiconductor package 400 during the manufacturing process, and provides an exploded view of part of the metallized surface 402 of the semiconductor die 104 to show the micropores 114 in greater detail. Solder 316 is applied to the metal die paddle 318 e.g. using a screen printing process. Lead and/or metal clip connections may be made to terminals at the top side 306 of the semiconductor die 104. The leads and/or metal clip may or may not comprise Cu and have a thermal conductivity in the range of 340 to 400 W/mK and an electrical conductivity in the range of 80 to 110% IACS and may or may not include micropores 114 having a diameter in a range of 1 μm to 10 μm. Any such package leads and metal clips are out of view in FIG. 4. In each case, the micropores 114 formed in the metallized surface 402 of the semiconductor die 104 are large enough to ensure good wettability between the solder 316 and the metallized surface 402 of the die 104. The micropores 114 are small enough to limit solder over spreading/overflow, ensuring a relatively uniform bond line thickness between the metal die paddle 318 and the bottom side 314 of the semiconductor die 104 and thus preventing die tilting.

In each of the semiconductor package embodiments previously described herein, the package 100/200/300/400 includes one or more metal surfaces 103, 109, 308, 402 which may comprise Cu, have has a thermal conductivity in the range of 340 to 400 W/mK and an electrical conductivity in the range of 80 to 110% IACS, and include micropores 114 having a diameter in a range of 1 μm to 10 μm. These surface(s) 103, 109, 308, 402 limit solder over spreading/overflow. Described next are embodiments of forming the porous Cu surfaces 103, 109, 308, 402.

Figure 5:
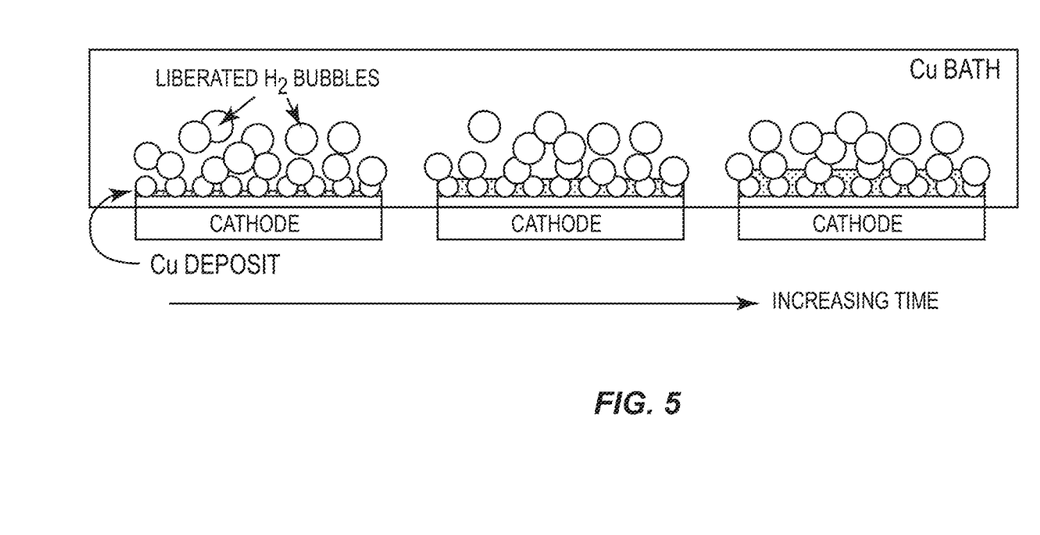
FIGS. 5 through 7 illustrate various views and a corresponding flow diagram of an embodiment of an electrodeposition process for forming micropores in a metal surface of a semiconductor package.
Figure 6:
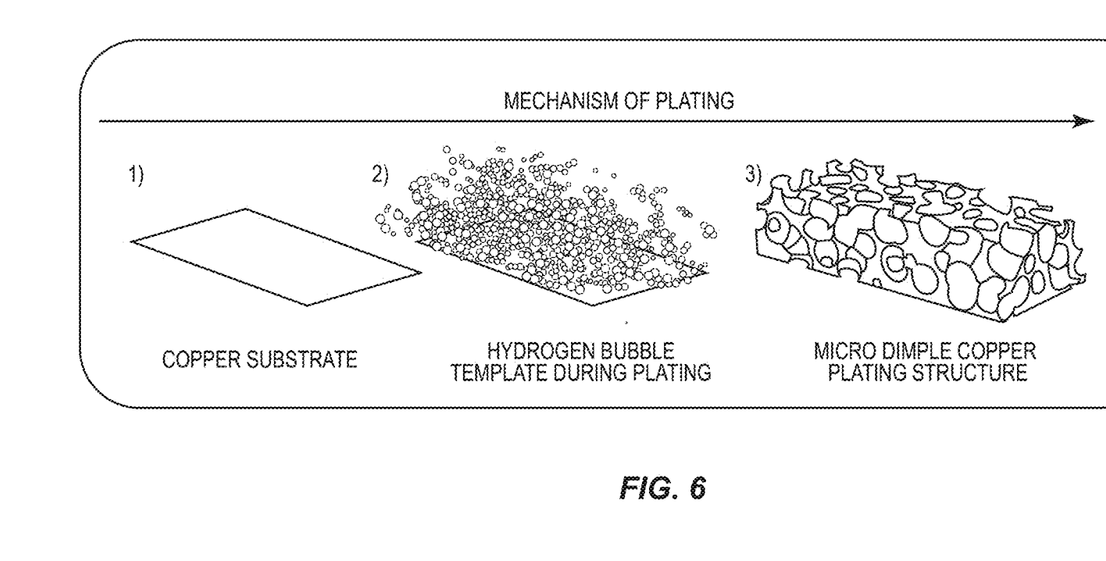
Figure 7:
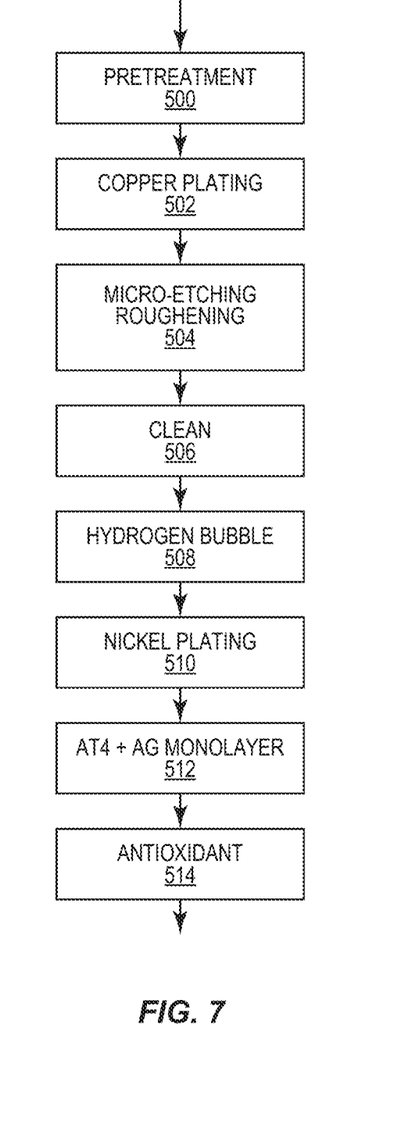

FIGS. 5 through 7 illustrate an embodiment in which the micropores 114 are formed by an electrochemical deposition (ECD) process. FIG. 5 shows a series of cross-sectional views during different stages of the ECD process. FIG. 6 shows related perspective views. FIG. 7 illustrates an embodiment of the ECD process.

The metal structure which is to have the micropores, such as one or more package leads, and/or a metallized surface of a semiconductor die, and/or an interconnect for attaching the die to the package leads, and/or one or more metal clips to be attached to the die, may be pre-treated prior to plating, e.g., to clean the metal structure (Block 500 in FIG. 7).

The pre-treated metal structure is immersed in a plating bath such as $CuSO_4$ and an electric current passes from an anode to the pre-treated metal structure through the plating bath to dissolve metal cations. The dissolved metal cations deposit on the metal structure which functions as a cathode during the ECD process, to form a thin metal coating on the pre-treated metal structure (Block 502 in FIG. 7). The metal structure being plated is labelled 'Cathode' in FIG. 5 and 'Copper substrate' in FIG. 6. The plated metal coating is labelled 'Cu deposit' in FIG. 5. The plated surface comprises Cu and has a thermal conductivity in the range of 340 to 400 W/mK and an electrical conductivity in the range of 80 to 110% IACS.

Micro-etching may be used to roughen the plated Cu surface during the ECD process (Block 504 in FIG. 7). The micro-etching process may include exposing the plated Cu surface to a typical etching process.

The plated Cu surface may be subjected to a cleaning process such as solvent cleaning, hot alkaline detergent cleaning, electrocleaning, acid treatment, etc. to remove molecular layers of oil which arise during ECD and can prevent adhesion of the plated coating (Block 506 in FIG. 7).

During the ECD process, hydrogen bubbles are introduced to form micropores in the plated Cu surface (Block 508 in FIG. 7). The plated Cu surface has a thermal conductivity in the range of 340 to 400 W/mK and an electrical conductivity in the range of 80 to 110% IACS and the micropores have a diameter in a range of 1 μm to 10 μm. Hydrogen bubbles may be introduced by adding a hydrogen source such as $(NH_4)_2SO_4$, $H_3BO_3$, etc. and one or more additives such as benzotriazole (BTA), ethylene diamine, etc. to the electrolytic bath solution.

The electrolytic bath solution is acidic and may include Cu ions, ammonium ions and organics substances. The acidity of the bath comes from sulphuric acid, or as an alternative hydrochloric acid may be used. For example, 1.2 to 1.8M of $H_2SO_4$ may be used. Acetic acid may be used as a bubble stabilizer. For example, 0.15 to 0.25M of $CH_3COOH$ may be used. The Cu ion source may be obtained from copper sulphate or copper chloride. For example, 0.3 to 0.5M of $CuSO_4$ may be used. Ammonium sulphate or ammonium chloride provide ammonium ions which help refine the pore size. For example, 0.9 to 1.5M of $(NH_4)_2SO_4$ may be used. Organic substances such as BTA or thiourea help with grain refining, e.g., by effecting mean pore size and pore density. For example, 0.003 to 0.005M of BTA may be used. Ethylene diamine also is a pore size modifier. $NH_4Cl$ is a mechanical strength modifier for the micropores. A gemini surfactant, which includes two conventional surfactant molecules chemically bonded together by a spacer, may be used to regulate the accumulation and detachability of hydrogen bubbles. Still other additives may be used such as polyethylene glycol, butynediol, HCl, etc. In each case, the hydrogen bubble source and additive(s) are selected to yield micropores having a diameter in a range of 1 μm to 10 μm. The inventors have found that micropores in this diameter range are effective at limiting solder over spreading/overflow in semiconductor packages.

FIG. 5 shows hydrogen bubbles being liberated during the ECD process and effecting the morphology of the plated Cu surface. The hydrogen source and additive(s) added to the Cu plating bath yield a 3D Cu plated surface with porous walls that include kernel-like copper deposits. FIG. 6 shows a progression from an initial copper substrate, through the ECD plating and hydrogen bubble process, and the resulting plated Cu surface with micropores having a diameter in a range of 1 μm to 10 μm. The micropores are labelled 'micro dimple' in FIG. 6.

The ECD process used to form the micropores employs cathodic plating, as described above. With pure copper as the plating substrate, likelihood of over hydrogenation of the copper electrode is low. The electrolytic bath concentration may be formulated to be low plating efficiency, no agitation and low temperature. Complexing agent and plating time may be optimized to control the diameter of the micropores, where micropore size decrease with reduced plating time. Micropore size also decreases with increased current density.

The micropores produced by the ECD process have a high degree of homogeneity and reproducibility. The micropores also have a more rounded shape as opposed to jagged edges. The porous Cu surface produced by the ECD process may have a surface roughness in a range of 1.5 μm and 20 μm, good purity (e.g. at least 99.99% Cu) and low contamination. The resulting micropores may have a minimum density of 70% and a surface ratio of at least 2, the surface ratio denoting a proportion of the measured area to total surface area. That is, the surfaces ratio corresponds to the area of the measurement divided by the surface area (e.g. the surface area of a convex body or a concave body).

After the micropores are formed in the plated Cu surface, the surface may be plated with a nickel strike layer, also known as a flash layer (Block 510 in FIG. 7). The strike layer is a thin layer of high-quality nickel plating which adheres to the base porous Cu surface and enhances mechanical stability. A monolayer comprising silver may then be applied to the optional nickel strike layer or directly to the porous Cu surface (Block 512 in FIG. 7). If a nickel strike layer is used, an antioxidation layer may be provided to protect the nickel from oxidation (Block 514 in FIG. 7). The manufacturing process may further include encapsulating components of the package such as a semiconductor die in a mold compound which is in contact some of the micropores, as previously described herein.

Figure 8:
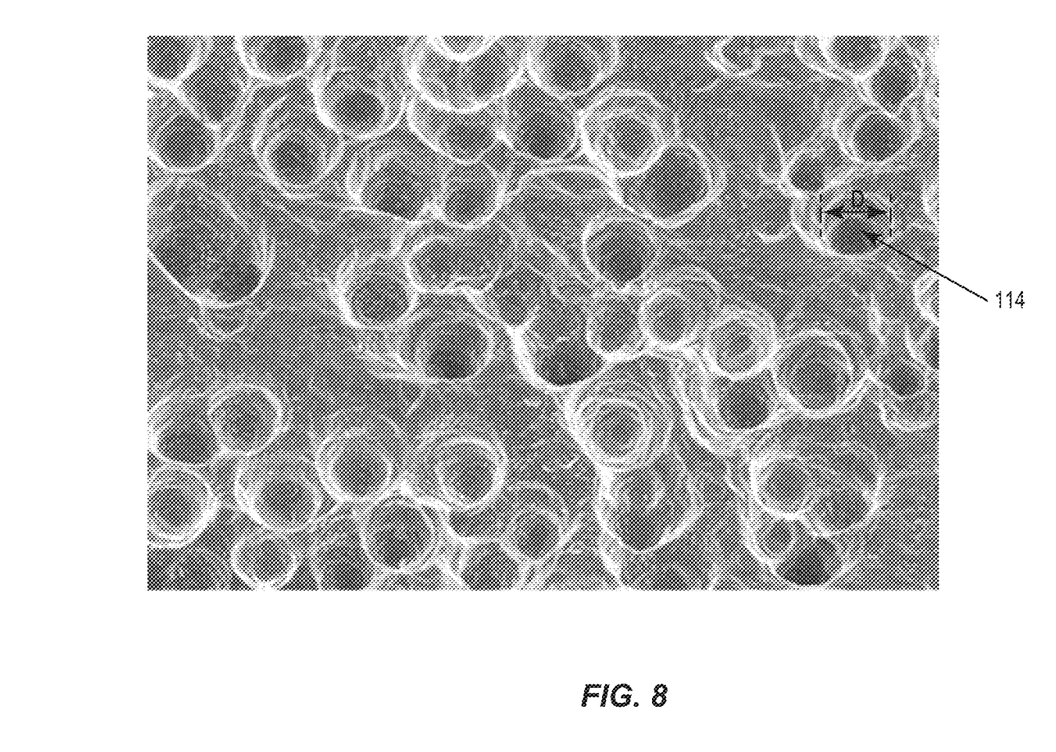
FIG. 8 is a scanning electron microscopy (SEM) micrograph of a metal surface included in a semiconductor package and produced according to the electrodeposition embodiment illustrated in FIGS. 5 through 7.

FIG. 8 shows a scanning electron microscopy (SEM) micrograph of a metal surface included in a semiconductor package and produced according to the electrodeposition embodiment illustrated in FIGS. 5 through 7. The metal surface comprises Cu, has a thermal conductivity in the range of 340 to 400 W/mK and an electrical conductivity in the range of 80 to 110% IACS, and include micropores 114 having a diameter (D) in a range of 1 μm to 10 μm. Such a metal surface may be formed on one or more leads of the package, and/or on a metallized surface of a semiconductor die, and/or on an interconnect for attaching the die to the package leads, and/or on one or more metal clips to be attached to the die, as previously described herein and illustrated in FIGS. 1 through 4.

In another embodiment, a metal surface of a semiconductor package that comprises Cu, has a thermal conductivity in the range of 340 to 400 W/mK and an electrical conductivity in the range of 80 to 110% IACS, and includes micropores having a diameter in a range of 1 μm to 10 μm may be formed by a Cu powder deposition process during which plasma-deposited Cu dust is formed on a Cu alloy.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor package, comprising:
   a plurality of metal leads; and
   a semiconductor die attached to the plurality of metal leads by an interconnect;
   wherein a surface of the plurality of metal leads, a metallized surface of the semiconductor die, and/or a surface of the interconnect comprises Cu and has a thermal conductivity in a range of 340 to 400 W/mK and an electrical conductivity in a range of 80 to 110% IACS (International Annealed Copper Standard),
   wherein one or more of the surfaces which comprises Cu and has a thermal conductivity in the range of 340 to 400 W/mK and an electrical conductivity in the range of 80 to 110% IACS also comprise micropores having a diameter in a range of 1 μm to 10 μm,
   wherein each surface which comprises Cu, has a thermal conductivity in the range of 340 to 400 W/mK and an electrical conductivity in the range of 80 to 110% IACS and comprises micropores is a surface that comprises plasma-deposited Cu dust on a Cu alloy and/or has a surface roughness in a range of 1.5 μm and 20 μm.

2. The semiconductor package of claim 1, wherein the plurality of metal leads are part of a leadframe, wherein the interconnect comprises a plurality of Cu pillars soldered to the plurality of leads, and wherein the surface of the plurality of metal leads comprises Cu, has a thermal conductivity in the range of 340 to 400 W/mK and an electrical conductivity in the range of 80 to 110% IACS and comprises micropores having a diameter in a range of 1 μm to 10 μm.

3. The semiconductor package of claim 2, wherein the surface of the plurality of Cu pillars has a thermal conductivity in the range of 340 to 400 W/mK and an electrical conductivity in the range of 80 to 110% IACS and comprises micropores having a diameter in a range of 1 μm to 10 μm.

4. The semiconductor package of claim 1, wherein the interconnect comprises a plurality of Cu pillars soldered to the plurality of leads, and wherein the surface of the plurality of Cu pillars has a thermal conductivity in the range of 340 to 400 W/mK and an electrical conductivity in the range of 80 to 110% IACS and comprises micropores having a diameter in a range of 1 µm to 10 µm.

5. The semiconductor package of claim 4, wherein the surface of the plurality of Cu pillars which has a thermal conductivity in the range of 340 to 400 W/mK and an electrical conductivity in the range of 80 to 110% IACS and comprises micropores is a plated surface, and wherein the Cu pillars comprise a nickel layer on which the plated surface is formed.

6. The semiconductor package of claim 1, further comprising a metal clip attached to a terminal of the semiconductor die at a side of the semiconductor die facing away from the plurality of leads, wherein a surface of the metal clip comprises Cu, has a thermal conductivity in the range of 340 to 400 W/mK and an electrical conductivity in the range of 80 to 110% IACS and comprises micropores having a diameter in a range of 1 µm to 10 µm.

7. The semiconductor package of claim 1, wherein the metallized surface of the semiconductor die is attached to a metal die paddle, and wherein the metallized surface of the semiconductor die comprises Cu, has a thermal conductivity in the range of 340 to 400 W/mK and an electrical conductivity in the range of 80 to 110% IACS and comprises micropores having a diameter in a range of 1 µm to 10 µm.

8. The semiconductor package of claim 1, wherein each surface which comprises Cu, has a thermal conductivity in the range of 340 to 400 W/mK and an electrical conductivity in the range of 80 to 110% IACS and comprises micropores is a plated surface on a Cu alloy.

9. The semiconductor package of claim 1, further comprising a mold compound encapsulating the semiconductor die, wherein the mold compound is in contact with some of the micropores.

10. A method of manufacturing a semiconductor package, the method comprising:
    forming a surface on a plurality of metal leads and which comprises Cu and has a thermal conductivity in a range of 340 to 400 W/mK and an electrical conductivity in a range of 80 to 110% IACS (International Annealed Copper Standard), a metallized surface on a semiconductor die and which comprises Cu and has a thermal conductivity in the range of 340 to 400 W/mK and an electrical conductivity in the range of 80 to 110% IACS, and/or a surface on an interconnect and which comprises Cu and has a thermal conductivity in the range of 340 to 400 W/mK and an electrical conductivity in the range of 80 to 110% IACS;
    forming micropores in one or more of the surfaces which comprise Cu and have a thermal conductivity in the range of 340 to 400 W/mK and an electrical conductivity in the range of 80 to 110% IACS, the micropores having a diameter in a range of 1 µm to 10 µm; and
    attaching the semiconductor die to the plurality of metal leads by the interconnect.

11. The method of claim 10, wherein the plurality of metal leads are part of a leadframe, wherein the interconnect comprises a plurality of Cu pillars, and wherein the surface of the plurality of metal leads comprises Cu, has a thermal conductivity in the range of 340 to 400 W/mK and an electrical conductivity in the range of 80 to 110% IACS and comprises micropores having a diameter in a range of 1 µm to 10 µm.

12. The method of claim 11, wherein the surface of the plurality of Cu pillars has a thermal conductivity in the range of 340 to 400 W/mK and an electrical conductivity in the range of 80 to 110% IACS and comprises micropores having a diameter in a range of 1 µm to 10 µm.

13. The method of claim 10, wherein the interconnect comprises a plurality of Cu pillars soldered to the plurality of leads, and wherein the surface of the plurality of Cu pillars has a thermal conductivity in the range of 340 to 400 W/mK and an electrical conductivity in the range of 80 to 110% IACS and comprises micropores having a diameter in a range of 1 µm to 10 µM.

14. The method of claim 10, further comprising:
    forming a surface on a metal clip and which comprises Cu and has a thermal conductivity in the range of 340 to 400 W/mK and an electrical conductivity in the range of 80 to 110% IACS;
    forming micropores in the surface of the metal clip, the micropores having a diameter in a range of 1 µm to 10 µm; and
    attaching the metal clip to a terminal of the semiconductor die at a side of the semiconductor die facing away from the plurality of leads.

15. The method of claim 10, further comprising:
    attaching the metallized surface of the semiconductor die to a metal die paddle,
    wherein the metallized surface of the semiconductor die comprises Cu, has a thermal conductivity in the range of 340 to 400 W/mK and an electrical conductivity in the range of 80 to 110% IACS and comprises micropores having a diameter in a range of 1 µm to 10 µm.

16. The method of claim 10, wherein each surface which comprises Cu and has a thermal conductivity in the range of 340 to 400 W/mK and an electrical conductivity in the range of 80 to 110% IACS is formed by an electrodeposition process, and wherein the micropores are formed by introducing hydrogen bubbles as part of the electrodeposition process.

17. The method of claim 10, wherein each surface which comprises Cu, has a thermal conductivity in the range of 340 to 400 W/mK and an electrical conductivity in the range of 80 to 110% IACS and comprises micropores is formed by a Cu powder deposition.

18. The method of claim 10, further comprising:
    encapsulating the semiconductor die in a mold compound which is in contact some of the micropores.

19. A leadframe, comprising:
    a plurality of metal leads having a surface which comprises Cu, a thermal conductivity in a range of 340 to 400 W/mK and an electrical conductivity in a range of 80 to 110% IACS (International Annealed Copper Standard); and
    micropores formed in the surface of the plurality of metal leads and having a diameter in a range of 1 µm to 10 µm,
    wherein the surface of the plurality of metal leads with the micropores comprises plasma-deposited Cu dust on a Cu alloy and/or has a surface roughness in a range of 1.5 µm and 20 µm.

20. The leadframe of claim 19, further comprising:
    a metal die paddle having a surface which comprises Cu, a thermal conductivity in the range of 340 to 400 W/mK and an electrical conductivity in the range of 80 to 110% IACS; and
    micropores formed in the surface of the metal die paddle and having a diameter in a range of 1 µm to 10 µm.

21. The leadframe of claim 19, wherein the surface of the plurality of metal leads with the micropores is a plated surface on a Cu alloy.

22. A method of manufacturing a leadframe, the method comprising:

forming a plurality of metal leads having a surface which comprises Cu, a thermal conductivity in a range of 340 to 400 W/mK and an electrical conductivity in a range of 80 to 110% IACS (International Annealed Copper Standard); and forming micropores in the surface of the plurality of metal leads, the micropores having a diameter in a range of 1 µm to 10 µm, and wherein:
  the surface of the plurality of metal leads is formed by an electrodeposition process and forming the micropores comprises introducing hydrogen bubbles as part of the electrodeposition process; or
  forming the surface of the plurality of metal leads comprises depositing, by plasma deposition, Cu dust on a Cu alloy.

23. The method of claim 22, further comprising:
forming a metal die paddle having a surface which comprises Cu, a thermal conductivity in the range of 340 to 400 W/mK and an electrical conductivity in the range of 80 to 110% IACS; and
forming micropores in the surface of the metal die paddle, the micropores in the surface of the metal die paddle having a diameter in a range of 1 µm to 10 µm.

24. The method of claim 22, wherein forming the surface of the plurality of metal leads comprises plating a Cu alloy.

25. The method of claim 22, further comprising:
roughening the surface of the plurality of metal leads to a surface roughness in a range of 1.5 µm and 20 µm.

26. The method of claim 25, wherein the micropores are formed by an electrochemical deposition (ECD) process, and wherein the surface of the plurality of metal leads is roughened by micro-etching during the ECD process.

27. A method of manufacturing a leadframe, the method comprising:
forming a plurality of metal leads having a surface which comprises Cu, a thermal conductivity in a range of 340 to 400 W/mK and an electrical conductivity in a range of 80 to 110% IACS (International Annealed Copper Standard);

forming micropores in the surface of the plurality of metal leads, the micropores having a diameter in a range of 1 µm to 10 µm; and roughening the surface of the plurality of metal leads to a surface roughness in a range of 1.5 µm and 20 µm.

28. A semiconductor package, comprising:

a plurality of metal leads; and a semiconductor die attached to the plurality of metal leads by an interconnect;

wherein a surface of the plurality of metal leads, a metallized surface of the semiconductor die, and/or a surface of the interconnect comprises Cu and has a thermal conductivity in a range of 340 to 400 W/mK and an electrical conductivity in a range of 80 to 110% IACS (International Annealed Copper Standard), wherein one or more of the surfaces which comprises Cu and has a thermal conductivity in the range of 340 to 400 W/mK and an electrical conductivity in the range of 80 to 110% IACS also comprise micropores having a diameter in a range of 1 µm to 10 µm, and wherein:
  the semiconductor package further comprises a metal clip attached to a terminal of the semiconductor die at a side of the semiconductor die facing away from the plurality of leads, and a surface of the metal clip comprises Cu, has a thermal conductivity in the range of 340 to 400 W/mK and an electrical conductivity in the range of 80 to 110% IACS and comprises micropores having a diameter in a range of 1 µm to 10 µm; and/or
  the metallized surface of the semiconductor die is attached to a metal die paddle and comprises Cu, has a thermal conductivity in the range of 340 to 400 W/mK and an electrical conductivity in the range of 80 to 110% IACS and comprises micropores having a diameter in a range of 1 µm to 10 µm.

* * * * *

UNITED STATES PATENT AND TRADEMARK OFFICE
CERTIFICATE OF CORRECTION

PATENT NO. : 10,914,018 B2
APPLICATION NO. : 16/351116
DATED : February 9, 2021
INVENTOR(S) : N. Pielmeier et al.

Page 1 of 1

It is certified that error appears in the above-identified patent and that said Letters Patent is hereby corrected as shown below:

In the Claims

Column 12, Line 42 (Claim 18, Line 3) please change "contact some" to -- contact with some --

Signed and Sealed this
Eleventh Day of May, 2021

Drew Hirshfeld
*Performing the Functions and Duties of the*
*Under Secretary of Commerce for Intellectual Property and*
*Director of the United States Patent and Trademark Office*